United States Patent [19]

Yu

[11] 4,091,380
[45] May 23, 1978

[54] PROGRAMMABLE BINARY AMPLIFIER

[75] Inventor: Chin C. Yu, Norristown, Pa.

[73] Assignee: Computer Peripherals, Inc., Rochester, Mich.

[21] Appl. No.: 728,356

[22] Filed: Sep. 30, 1976

Related U.S. Application Data

[63] Continuation of Ser. No. 557,632, Mar. 12, 1975, abandoned.

[51] Int. Cl.$^2$ .......................... G11B 5/02; H03G 3/30
[52] U.S. Cl. .............................. 340/347 DD; 330/86; 330/144; 360/67
[58] Field of Search ................ 340/347 AD, 347 DD; 330/29, 51, 86, 144; 360/39, 40, 65, 67

[56] References Cited

U.S. PATENT DOCUMENTS

| | | | |
|---|---|---|---|
| 3,308,392 | 3/1967 | McCarter | 330/144 |
| 3,331,028 | 7/1967 | Bay et al. | 330/86 |
| 3,425,051 | 1/1969 | Smith | 340/347 AD |
| 3,444,550 | 5/1969 | Paulus | 340/347 AD |
| 3,464,022 | 8/1969 | Locheed et al. | 330/144 |
| 3,579,138 | 5/1971 | Harris et al. | 330/86 |
| 3,662,365 | 5/1972 | Rodriguez et al. | 330/29 |
| 3,742,489 | 6/1973 | Lefevre et al. | 330/51 |

Primary Examiner—Jerry Smith

Attorney, Agent, or Firm—J. T. Cavender; Wilbert Hawk, Jr.; Richard W. Lavin

[57] ABSTRACT

A multistage amplifier having an automatically programmable gain is disclosed in which the amplifier gain is incremented in binary steps to a desired level. Each amplifier stage is switchable between a first and second gain in a binary sequence such that the four digit output of a sixteen bit counter will increment the total amplifier gain in sixteen binary steps.

A readback and decoding circuit for reading magnetic tape is also disclosed in which the signal amplitude of data read from the magnetic tape is compared to a reference voltage which corresponds to the data readback clipping level. Only amplified data which exceeds the predetermined clipping level is gated out of the circuit for processing. Since input signal amplitude varies from tape to tape and from head to head, the automatic read amplification burst on each tape is used to preset the amplifier gain such that the amplified amplitude of the readback signal is maintained constant as long as the readback signal supplied to the amplifier is within a predetermined range. The amplifier gain is automatically incremented until the amplifier output exceeds the clipping level, thereby insuring that only valid data and not noise or undecodable data are processed.

16 Claims, 3 Drawing Figures

PROGRAMMABLE BINARY AMPLIFIER

This is a continuation of application Ser. No. 557,632, filed Mar. 12, 1975, now abandoned.

BACKGROUND OF THE INVENTION

1. Field of the Invention

The present invention relates to multistage amplifiers having automatic gain control and more particularly to an amplifier having a gain incrementable in binary steps according to the relationship $G = (A)^n$ where A is any number and $n$ is any integer, and in which the number of stages of amplification corresponds to the number of digits in a binary number while the number of gain increments corresponds to all of the binary numbers countable from the number of binary digits employed. The present invention also relates to magnetic tape readback data decoding and more particularly to a decoding circuit in which data errors resulting from noise in the interblock gap periods and from decoded data having signal amplitudes below that required for accurate decoding, are eliminated.

2. Description of the Prior Art

Automatic gain control amplifiers of the prior art have a gain which is variable in accordance with variations in the input signal applied thereto. This presents a problem in data decoders in which the decoded data signal level must remain level, when the input signal level is variable as occurs in magnetic tape readback systems. The gain of such prior art AGC amplifiers is not constant over particular ranges of input signal amplitudes, but rather varies continuously. In accordance with the present invention, a simple, accurate and inexpensive amplifier is disclosed in which the gain thereof is initially set at any one of a number of possible levels in accordance with the characteristics of the particular tape to be read, and variation of data signal amplitude will not vary the amplifier gain once set.

A data decoding system of the prior art is disclosed by U.S. Pat. No. 3,715,738, wherein data signal peaks are sensed and compared with threshold levels to produce data pulses which correspond to the sensed signal peaks. This signal is also compared to the data clipping levels to produce gating pulses when the clipping levels are exceeded.

An AGC amplifier of the prior art is disclosed by U.S. Pat. No. 3,660,821, in which the tape preamble data is coupled to the amplifier to set the amplifier gain, which may then be intermittently varied in accordance with a predetermined reference level.

Another problem of prior art AGC amplifiers is their complexity and low peak to peak output voltage swing when integrated circuit design is used. The present invention has a number of gain increments that are exponentially related to the number of stages of amplification, with each increment being binarily related to the other increments.

SUMMARY OF THE INVENTION

The invention is directed to an improved readback circuit for decoding data from magnetic tape having interblock gap noise and having data recorded thereon at varying flux densities. The present invention comprises a binary incremented multistage amplifier and gain control therefor in which the amplifier gain is incremented in binary steps until a predetermined reference amplitude is reached. The reference amplitude is a function of the amplifier output. Upon receipt of a data signal, a digital counter increases the amplifier gain in binary increments until the amplifier output reaches the reference level, at which time a feedback signal stops the counter and sets the amplifier gain for all incoming data having a signal amplitude which exceeds the reference level. Each amplifier stage is switchable between two possible gains, with the number of gain increments being the largest binary number countable from a number of binary digits equal to the number of stages of amplification.

It is therefore an object of the invention to provide an improved readback circuit for decoding data from magnetic tape.

It is another object of the invention to provide an improved amplifier having an incremental gain and having a constant output signal amplitude for input signals having amplitudes variable between predetermined limits.

It is another object of the invention to provide an amplifier gain control for incrementing the amplifier gain in binary steps by sequentially varying the gain of selected amplifier stages.

The foregoing and other features and advantages of the invention will be apparent from the following detailed description of the preferred embodiment of the invention together with the accompanying drawings.

DESCRIPTION OF THE PREFERRED EMBODIMENT

Figure 1:
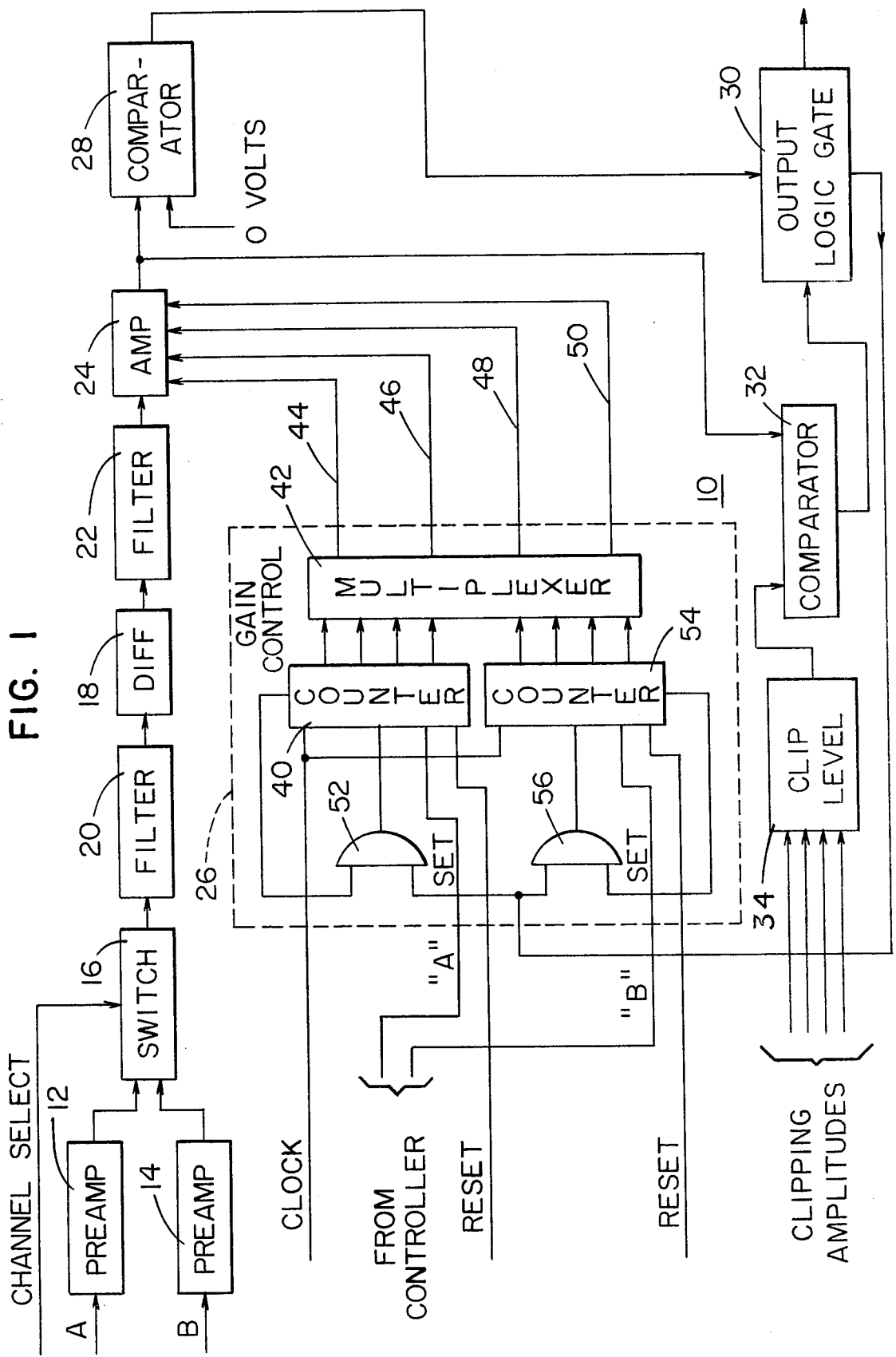
FIG. 1 is a block diagram of an improved magnetic tape readback circuit which embodies the present invention.

Referring now to FIG. 1, a data decoding circuit embodying the present invention is illustrated generally at 10 wherein data recorded on magnetic tape is read by magnetic reading heads and received as input data on a pair of channels A and B, each of which channel may correspond to data read by a particular reading head. As is well known, the signal to noise ratio of data decoded from magnetic tape will vary from tape to tape in accordance with many factors, among which are the tape characteristics, recording head characteristics, and any interference which may have been present when the data was recorded. Each magnetic tape has recorded thereon near the beginning of the tape a string of flux reversals, normally logical ones, called the automatic read amplification burst (hereinafter called the ARA burst). This burst of ones appears as a preamble in all of the data tracks and is used to determine the amplification required to decode the data from tape to tape. Once the requisite amplifier gain is set by comparison of the ARA burst signal strength to some predetermined reference, data, which appears in blocks on the tape separated by interblock gaps, is decoded. The interblock gaps, as is well known, are DC erased sections of tape separating the data blocks.

Data from channels A and B is amplified and shaped by preamplifiers 12 and 14, respectively, with the resulting analog data signal being detected by detection of the data zero voltage crossings. The zero crossing technique of data decoding is well known, and reference may be made to U.S. Pat. No. 3,727,079 for a description of a typical zero crossing detecting circuit. Channel selection is made by an analog switch 16 which couples incoming data to a differentiation network 18 after filtering by a low pass filter 20. Another low pass filter 22 removes high frequency noise prior to signal amplification by amplifier 24. The gain of amplifier 24 is uniquely determined by a gain control circuit 26 such that the signal amplitude applied to the zero crossing detector 28 which is shown as comparator 28, remains constant as long as the data signal amplitude is within predetermined range. Comparator 28 has an output whenever the input data signal exceeds a reference voltage, zero volts, which enables each zero crossing to be detected. Recovered data from comparator 28 is coupled to output logic gating circuitry 30, which couples the data out for utilization when a coincident output gating signal from a second comparator 32 is also applied to the output logic gate 30, which effectively operates as an AND gate for the outputs of comparators 28 and 32.

In systems of the prior art, recovered data from comparator 28 might contain unacceptable errors caused by noise in the interblock gaps which, if decoded, appears as false data. Also, the magnetization flux on the tape, for whatever reason, may be below the minimum strength necessary to produce a decodable signal amplitude, resulting in a loss of data. To insure that only valid decoded data is gated out from gate 30, the gate control comparator 32 has a reference voltage level high enough to insure that the decoded data was of sufficient signal amplitude. As a practical matter, the reference level of comparator 32 is selected by a clipping level selector 34 which, in the exemplary circuit illustrated, provides four amplitude levels of clipping of the data signal, with selection being dependent primarily upon the selected amplifier gain and the type of signal received. The clipping level of the data signal provides a level change for each data occurrence, and in actual systems having both read and write capabilities, is highest while writing, at an intermediate level while reading and writing simultaneously, and at the lowest level when reading only.

As previously mentioned, the data signal amplitude coupled from the magnetic heads via channels A and B to the zero crossing detector 28 varies with different tapes, the condition of the reading head and even with different data tracks on the same recording head. In accordance with the present invention, once the clipping level of a standard clipping circuit 34 is set, the same level will provide an accurate reference for comparator 32 to compare with the received data, regardless of the beforementioned variations in signal amplitude, because the signal amplitude applied to comparators 28 and 32 is maintained constant by amplifier 24 as will be described with reference to FIG. 2, as long as the data signal applied to amplifier 24 is within a predetermined range.

Figure 2:
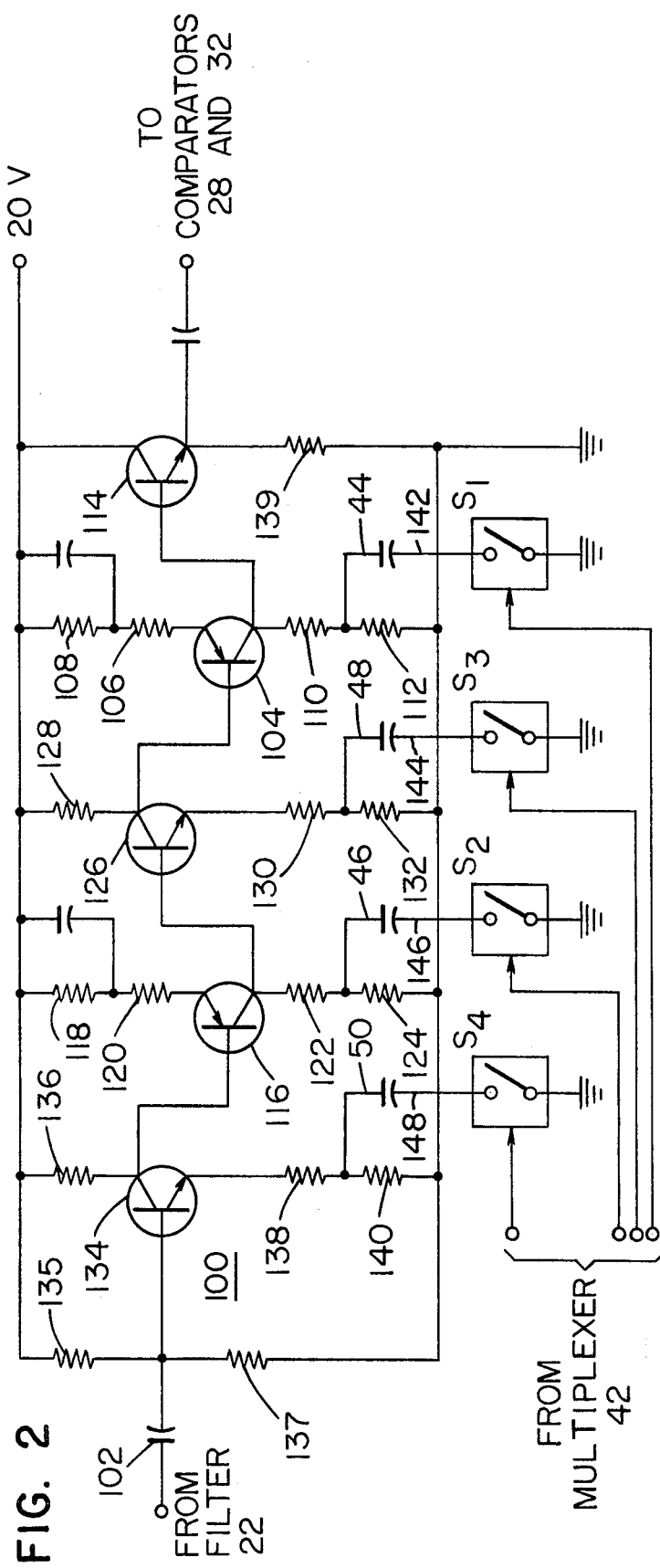
FIG. 2 is a schematic diagram of a preferred embodiment of an amplifier having a programmable gain in accordance with the present invention.

Referring now to FIG. 2, a programmable amplifier in which the overall gain thereof is incrementable in binary steps is shown generally at 100. The amplifier comprises four stages of amplification and an emitter follower. While the amplifier is illustrated with collector to base coupling between stages, the particular coupling of stages and the biasing therefor is illustrative only, as other well known amplifier stage coupling may be employed or additional stages of amplification may be added. In the disclosed embodiment, an alternately grounded emitter and grounded collector configuration is used to eliminate capacitive coupling between stages and to obtain the desired biasing.

The total amplifier gain $G_T$ may be expressed as:

$$G_T = k(A)^n$$

where $k$ is a constant which, for purpose of illustration is one, where A is a number, which when increased exponentially becomes the amplifier gain and $n$ is the binary power to which the gain function A is raised. While (A) and ($n$) may be any reasonable numbers, a four digit binary counter counts through sixteen steps, therefore, $n$ is chosen to be 0 through 15. In a five stage amplifier, $n$ would be 0 through 31, in a six stage amplifier $n$ would be 0 through 63 and so on. For the four stage amplifier illustrated, the total gain is also expressed as the product of the gain of the individual stages of amplification, thus $$G_T = G_1 G_2 G_3 G_4$$

where $G_1$ through $G_4$ are the gains of stages one through four respectively.

The incoming preamplified data signal is capacitively coupled from low pass filter 22 to amplifier 24 across coupling capacitor 102. Typically, the incoming data signal amplitude varies between 70 millivolts and one volt. Each amplifier stage has two possible gains, which results from a resistance associated with each stage being switched either into or out of the respective amplifier stage under the control of the gain control circuit 26. Stage one comprises transistor 104 and associated emitter biasing resistors 106 and 108 and collector biasing resistors 110 and 112. A common voltage source of 20 volts is coupled across all of the amplifier stages, including emitter follower 114, which has a gain of one. Stage two comprises transistor 116 with emitter biasing resistors 118 and 120 and collector biasing resistors 122 and 124, stage three comprises transistor 126 and its associated collector biasing resistor 128 and emitter biasing resistors 130 and 132, and stage four comprises transistor 134 with collector bias provided by resistor 136 and emitter bias by resistors 138 and 140. The above-mentioned biasing resistors are selected such that the gain of stage 1 is determined by the ratio of resistance 106 to resistance 110 and 112, the gain of stage 2 by the ratio of resistance 120 to resistance 122 and 124, the gain of stage 3 by the ratio of resistance 128 to resistance 130 and 132 and the gain of stage 4 by the ratio of resistance 136 to resistance 138 and 140. When resistances 112, 132, 124 and 140 are selectively shorted by switching lines 142, 144, 146 and 148 to ground, it is apparent that the gain of each stage has two possible values. The resistance values are chosen so that:

stage 1 gain $G_1 = (A)^0$ or $(A)^1$ stage 2 gain $G_2 = (A)^0$ or $(A)^2$ stage 3 gain $G_3 = (A)^0$ or $(A)^4$ stage 4 gain $G_4 = (A)^0$ or $(A)^8$ The operation of the gain control circuit 26 will now be described. The Automatic Read Amplification burst of logical ones (the ARA burst) at the beginning of each magnetic tape is coupled as an analog data signal through the decoding network for amplification. When a channel A ARA burst is read, a signal is coupled to set a channel A sixteen bit counter 40 to begin counting at a rate determined by an external clock, which may be at 5KH$_z$. A multiplexer circuit 42, which may comprise a standard integrated circuit chip such as Texas Instruments 74157 multiplexer, couples the four digit binary output from counter 40 to the amplifier 24 via four lines 44, 46, 48 and 50 which are coupled to stages one through four respectively. Lines 44 through 50 are coupled and decoupled to ground in a binary sequence in accordance with the counter output to increase the amplifier gain in sixteen discrete steps. At the same time, the output of comparator 32, which exists only when the amplifier gain is sufficient to amplify the incoming data signal such that its amplitude exceeds the clipping level reference voltage, is fed back from the output gate 30 to the input of counter 40 via an OR gate 52. Upon receipt of this feedback signal, counter 40 stops counting and thereby sets the gain of amplifier 24 at a level sufficient to amplify incoming data above the preset clipping level, but not at an unnecessarily high level which would distort the readback signal. In the event that the amplifier gain still is insufficient to overcome the clipping level at the sixteenth count, then an overflow signal from the counter 40 which is OR'ed with the feedback signal will stop the counter at its maximum count, which corresponds to the maximum amplifier gain. A data input on channel B is detected identically to a data input on channel A, with the channel B sixteen bit counter 54 being set by receipt of the channel B readback signal. Once set, counter 54 counts through its sixteen counts at the 5KH$_z$ rate until stopped by a feedback signal from output gate 30 which is coupled thereto by OR gate 56.

By an appropriate selection of amplifier circuit parameters, an amplifier may be designed having an output voltage swing greater than 10 volts peak to peak. Typical resistor values are as follows:

| Stage 1: | $R_{106} + R_{108}$ | = 3.6K ohm |
|---|---|---|
|  | $R_{110}$ | = 3K |
|  | $R_{112}$ | = .6K |
| Stage 2: | $R_{118} + R_{120}$ | = 2.88K |
|  | $R_{122}$ | = 2K |
|  | $R_{124}$ | = .880K |
| Stage 3: | $R_{128}$ | = 2.07K |
|  | $R_{130}$ | = 1.0K |
|  | $R_{132}$ | = 1.07K |
| Stage 4: | $R_{136}$ | = 4.3K |
|  | $R_{138}$ | = 1K |
|  | $R_{140}$ | = 3.3K |

To complete the illustrated amplifier circuit, resistance 135 and 137 may have values of 3K ohms and 2K ohms, respectively, while emitter follower resistance 139 may have a value of 1K ohms. The resulting amplifier gain is then binarily incremented according to the following table for the above values as either counter 40 or 54 counts through its sixteen steps, with the gain increment A, which for the selected resistance values is 1.2, raised to the $n$th power.

While in the present invention the gain incrementation is defined as "binary", this definition is intended to encompass the exponential incrementation of any gain value A; thus it is clear that A may comprise numbers other than two. When A does comprise numbers other than two; i.e., 1.2, the incrementation is still to be considered as binary.

| step (n) | binary count | $G_4$ | $G_3$ | $G_2$ | $G_1$ | $G_T$ |
|---|---|---|---|---|---|---|
| 0 | 0000 | 1 | 1 | 1 | 1 | 1 |
| 1 | 0001 | 1 | 1 | 1 | 1.2 | 1.2 |

-continued

| step (n) | binary count | $G_4$ | $G_3$ | $G_2$ | $G_1$ | $G_T$ |
|---|---|---|---|---|---|---|
| 2 | 0010 | 1 | 1 | 1.44 | 1 | 1.44 |
| 3 | 0011 | 1 | 1 | 1.44 | 1.2 | 1.73 |
| 4 | 0100 | 1 | 2.07 | 1 | 1 | 2.07 |
| 5 | 0101 | 1 | 2.07 | 1 | 1.2 | 2.48 |
| 6 | 0110 | 1 | 2.07 | 1.44 | 1 | 2.97 |
| 7 | 0111 | 1 | 2.07 | 1.44 | 1.2 | 3.56 |
| 8 | 1000 | 4.3 | 1 | 1 | 1 | 4.30 |
| 9 | 1001 | 4.3 | 1 | 1 | 1.2 | 5.16 |
| 10 | 1010 | 4.3 | 1 | 1.44 | 1 | 5.96 |
| 11 | 1011 | 4.3 | 1 | 1.44 | 1.2 | 7.13 |
| 12 | 1100 | 4.3 | 2.07 | 1 | 1 | 8.90 |
| 13 | 1101 | 4.3 | 2.07 | 1 | 1.2 | 10.68 |
| 14 | 1110 | 4.3 | 2.07 | 1.44 | 1 | 12.82 |
| 15 | 1111 | 4.3 | 2.07 | 1.44 | 1.2 | 15.39 |

As is apparent, the output logic operates as an AND gate which prevents recovered readback data having a signal amplitude less than the predetermined clipping level from being processed, thereby insuring that only decodable data is processed.

Figure 3:
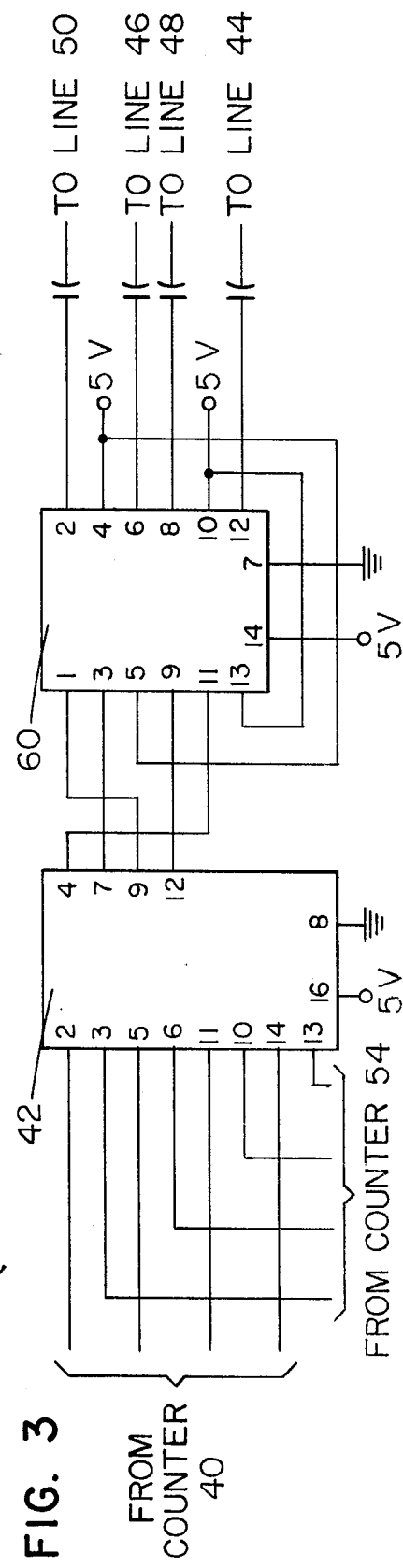
FIG. 3 is a more detailed schematic diagram of a portion of the embodiment illustrated by FIG. 2.

Referring now to FIG. 3, an integrated circuit configuration for the coupling of the output of the multiplexer 42 to the gain control switches $S_1$ through $S_4$ is illustrated. Integrated circuit multiplexer 42, which may comprise a Texas Instruments part 74157 having pin connections from binary counters 40 and 54 as illustrated, has sixteen possible outputs on its four output lines, which are coupled to another integrated circuit switch 60, which includes therein switches $S_1$ through $S_4$. Switch 60 is shown as a Texas Instruments part 7406 having pin connections as shown. Switch 60 also internally inverts the various switching signals to maintain correct polarity between the integrated circuit chips 42 and 60 and the supply voltages applied thereto.

While the invention has been shown and described with reference to a preferred embodiment thereof, it will be understood that persons skilled in the art may make modifications thereof without departing from the spirit and scope of the invention as defined by the claims appended hereto.

What is claimed is:

1. In a data decoding system for decoding data signals read from magnetic tape, the magnetic tape including first reference signals recorded thereon at the beginning of the tape, the improvement comprising:
    amplifier means for receiving said first reference signals and said data signals read from the tape for amplifying said signals, said amplifier means including a plurality of stages of amplification for amplifying said signals, each stage having a gain of either one or $A^n$ where A is a number greater than one and where $n$ is an integer equal to or greater than zero and selected to form a binary progression, said stages having an output signal whose gain is equal to the product of a gain of each stage of amplification;
    a plurality of switches corresponding in number to the number of stages of amplification with each of said switches being associated with a respective stage of amplification and coupled to each of said amplifier stages for incrementally changing the gain of each stage from one to $A^n$ when operated;
    a binary counter operated by said first reference signals to incrementally output a predetermined number of increasing binary numbers;
    decoding means coupled to said switches and said binary counter for receiving the binary output of said counter to operate said switches in accordance with the binary output of said counter wherein the amplifier gain is sequentially incremented through a number of increments corresponding to said predetermined number counted by said counter;

a source of second reference signals representing a voltage level of a predetermined magnitude greater than zero;

first means for comparing the output of the amplifier to a referece voltage equal to zero and having an output when the amplitude of the amplifier signal exceeds said reference voltage;

second means for comparing the output of the amplifier to said second reference signals and having an output when the amplified signal exceeds said second reference signals;

and means coupling the output of said second comparing means to said binary counter for inhibiting the incrementing of said counter whereby the gain of the amplifier is set at a level equal to the output of the binary counter.

2. A programmable amplifier in accordance with claim 1 wherein the number of stages of amplification are four with each stage having a gain of either 1 or $A^n$ where $1 < A < 2$ and $0 \leq n < 16$.

3. A programmable amplifier in accordance with claim 2 wherein said counter comprises a sixteen bit binary counter for incrementally increasing the total amplifier gain from $(A)^0$ to $(A)^{15}$ in sixteen binary steps.

4. A programmable amplifier in accordance with claim 3 wherein each amplifier stage is a transistor amplifier and wherein the gain of the first and second stages is determined by the ratio of the collector to emitter resistance and the gain of the third and fourth stages is determined by the ratio of the emitter to collector resistance, said switches are connected to a resistance in each stage to decrease the collector resistance in said first and second stages and the emitter resistance in said third and fourth stages when operated to sequentially and incrementally increase the total amplifier gain by said binary steps.

5. A programmable amplifier in accordance with claim 4 wherein the gain of said first stage is switchable between $A^0$ and $A^1$, the gain of said second stage is switchable between $A^0$ and $A^2$, the gain of said third stage is switchable between $A^0$ and $A^4$, and the gain of said fourth stage is switchable between $A^0$ and $A^8$.

6. In a data decoding system for decoding data signals read from magnetic tape, the magnetic tape including first reference signals recorded thereon at the beginning of the tape, the improvement comprising:

a multi-stage amplifier for receiving said first reference signals and said data signals read from the tape for amplifying said signals, said amplifier being programmable to assume a plurality of different gains with each of the gains of the amplifier being related in a binary sequence $KA^n$ where $K$ is an arbitrary constant, $A$ is the gain of one amplifier stage and $n$ is an integer including zero;

means for decoding said amplified signals for deriving a decoded data signal, said decoding means including a source of second reference signals representing a voltage level of a predetermined magnitude greater than zero;

first means for comparing the output of the amplifier to a reference voltage equal to zero and having an output when the amplitude of the amplifier signal exceeds said reference voltage;

second means for comparing the output of the amplifier to said second reference signals and having an output when the amplified signal exceeds said second reference signals;

a binary counter operated by said first reference signals to sequentially output a plurality of increasing binary numbers;

switch means coupled to the output of said binary counter for incrementally increasing the gain of the amplifier in accordance with the output of said binary counter;

feedback means for coupling the output of said second comparing means to said binary counter for inhibiting the incrementing of said counter whereby the gain of the amplifier is set at a level equal to the output of the binary counter;

and gating means responsive to the outputs of said first and second comparing means for gating said decoded data signals from said first comparing means through said gating means when said second comparing means has an output in coincidence therewith.

7. A data decoding system in accordance with claim 6 wherein $A$ is a number between one and two and $n$ is an integer from zero through fifteen.

8. A data decoding system in accordance with claim 6 wherein each amplifier stage has a gain of either one or $A^n$.

9. A data decoding system in accordance with claim 6 wherein:

said second reference voltages comprise a plurality of signal clipping levels in accordance with the type of operation of said data decoding system; and means is provided for selectively coupling said clipping level voltages to said second comparator.

10. A data decoding system in accordance with claim 6 wherein said counter comprises a sixteen bit binary counter for incrementally increasing the total amplifier gain from $(A)^0$ to $(A)^{15}$ in sixteen binary steps.

11. A data decoding system in accordance with claim 10 wherein said amplifier comprises at least four stages, each stage being a transistor amplifier and wherein the gain of the first and second stages is determined by the ratio of the collector to emitter resistance and the gain of the third and fourth stages is determined by the ratio of the emitter to collector resistance, said switches are connected to a resistance in each stage to decrease the collector resistance in said first and second stages and the emitter resistance in said third and fourth stages when operated to sequentially and incrementally increase the total amplifier gain by said binary steps.

12. A data decoding system in accordance with claim 11 wherein the gain of said first stage is switchable between $A^0$ and $A^1$, the gain of said second stage is switchable between $A^0$ and $A^2$, the gain of said third stage is switchable between $A^0$ and $A^4$, and the gain of said fourth stage is switchable between $A^0$ and $A^8$.

13. In a system for decoding data signals read from a multi-channel magnetic tape wherein each channel has recorded therein a first reference signal located at the start of the channel, the improvement comprising:

a four stage amplifier for amplifying the first reference signal read from one of the channels of the magnetic tape, each stage having a gain of either one or $A^n$ where A is a number greater than one and $n$ is an integer equal to or greater than zero and wherein the first stage has a gain of either $A^o$ and $A^1$, the second stage has a gain of either $A^o$ and $A^2$, the third stage has a gain or either $A^o$ and $A^4$, and the fourth stage has a gain of either $A^o$ and $A^8$, and said amplifier having an output signal whose gain is equal to the product of the gain of each of the four stages of the amplifier;

a plurality of switches each coupled to one of said stages of the amplifier for changing the gain of its associated stage from 1 to $A^n$ when operated;

a plurality of four-bit binary counters, each coupled to the one channel of the magnetic tape and operated by said first reference signal recorded on that channel to incrementally output a predetermined number of increasing binary numbers;

multiplexing means coupled to said switches and receiving the output of said binary counters to selectively operate said switches in accordance with the binary output of said counters wherein the gain of each amplifier stage is sequentially incremented through a number of increments corresponding to the binary number counted by said counters;

a source of second reference signals representing a voltage level of a predetermined magnitude greater than zero;

first means for comparing the output of the amplifier to a reference voltage equal to zero and having an output when the amplified signal exceeds said reference voltage;

second means for comparing the output of the amplifier to said second reference signals and having an output when the amplified signal exceeds said second reference signals;

feedback means for coupling the output of said second comparing means to said binary counters for inhibiting the incrementing of said counters whereby the gain of the amplifier is set at a level equal to the output of the binary counter;

and gating means responsive to the output of said first and second comparing means for gating decoded data signals read from the one channel of the magnetic tape from said first comparing means through said gating means when said second comparing means has an output in coincidence therewith.

14. A data decoding system in accordance with claim 13 wherein each amplifier stage is a transistor amplifier and wherein the gain of the first and second stages is determined by the ratio of the collector to emitter resistance and the gain of the third and fourth stages is determined by the ratio of the emitter to collector resistance, said switches are connected to a resistance in each stage to decrease the collector resistance in said first and second stages and the emitter resistance in said third and fourth stage when operated to sequentially and incrementally increase the total amplifier gain by said binary steps.

15. A programmable amplifier having a gain variable in incremental binary steps comprising:

a four stage transistor amplifier for amplifying a data signal, each stage having a gain of either one or $A^n$ where A is a number greater than one less than two and $n$ is an integer equal to or greater than zero but less than sixteen, said stages having an output signal whose gain is equal to the product of the gain of each stage of amplification wherein the gain of the first and second stages is determined by the ratio of the collector to emitter resistance and the gain of the third and fourth stages is determined by the ratio of the emitter to collector resistance;

a source of first reference signals for inputting into the said stages of amplification;

a binary counter operated by said first reference signals to incrementally output a predetermined number of increasing binary numbers, said counter comprising a sixteen bit binary counter incrementally increasing the total amplifier gain from $(A)^o$ to $(A)^{15}$ in sixteen binary steps;

a plurality of switches corresponding in number to the number of amplifier stages with each of said switches being associated with a respective stage of amplification and coupled to each of said amplifier stages for incrementally changing the gain of each stage from one to $A^n$ when operated, said switches being connected to a resistance in each stage to decrease the collector resistance in said first and second stages and the emitter resistance in said third and fourth stages when operated to sequentially and incrementally increase the total amplifier gain by said binary steps;

decoding means coupled to said switches and said binary counter for receiving the binary output of said counter to operate said switches in accordance with the binary output of said counter wherein the amplifier gain is sequentially incremented through a number of increments corresponding to said predetermined number counted by said counter;

a source of second reference signals;

and means for comparing the output signal of said transistor stages derived from said first reference signals with said second reference signals and responsive to said output signal being equal to or exceeding said second reference signal for inhibiting the incrementing of said binary counter.

16. A programmable amplifier in accordance with claim 15 wherein the gain of said first stage is switchable between $A^o$ and $A^1$, the gain of said second stage is switchable between $A^o$ and $A^2$, the gain of said third stage is switchable between $A^o$ and $A^4$, and the gain of said fourth stage is switchable between $A^o$ and $A^8$.

* * * * *